US012808958B2

(12) United States Patent
Kaneko et al.

(10) Patent No.: US 12,808,958 B2
(45) Date of Patent: Nov. 24, 2026

(54) IMAGING SUPPORT DEVICE, MAGNETIC RESONANCE IMAGING APPARATUS INCLUDING IMAGING SUPPORT DEVICE, AND IMAGING SUPPORT METHOD

(71) Applicant: FUJIFILM Corporation, Tokyo (JP)

(72) Inventors: Yukio Kaneko, Tokyo (JP); Yosuke Otake, Tokyo (JP); Suguru Yokosawa, Tokyo (JP); Toru Shirai, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 164 days.

(21) Appl. No.: 18/823,621

(22) Filed: Sep. 3, 2024

(65) Prior Publication Data

US 2025/0102600 A1 Mar. 27, 2025

(30) Foreign Application Priority Data

Sep. 22, 2023 (JP) ................................ 2023-158720

(51) Int. Cl.
*G01R 33/28* (2006.01)

(52) U.S. Cl.
CPC ......... *G01R 33/283* (2013.01); *G01R 33/288* (2013.01)

(58) Field of Classification Search
CPC ... G01R 33/283; G01R 33/288; G01R 33/543
See application file for complete search history.

(56) References Cited

U.S. PATENT DOCUMENTS

| | | | | |
|---|---|---|---|---|
| 2009/0021257 | A1* | 1/2009 | Yasuhara | A61B 5/055 324/318 |
| 2010/0156421 | A1* | 6/2010 | Sukkau | G01R 33/3415 324/318 |
| 2010/0244833 | A1* | 9/2010 | Sakakura | A61B 5/704 324/309 |
| 2013/0342851 | A1 | 12/2013 | Dresel et al. | |
| 2018/0014745 | A1* | 1/2018 | Senegas | A61B 5/055 |
| 2018/0314891 | A1* | 11/2018 | Ota | G16H 40/63 |
| 2020/0178839 | A1* | 6/2020 | Krishnaiyer Raman | A61B 5/0077 |
| 2021/0121092 | A1* | 4/2021 | Kawajiri | A61B 5/704 |
| 2021/0312659 | A1 | 10/2021 | Sommer et al. | |
| 2022/0260656 | A1 | 8/2022 | Hatakenaka et al. | |
| 2023/0248255 | A1* | 8/2023 | Mailhe | A61B 5/7264 600/408 |

FOREIGN PATENT DOCUMENTS

| | | | |
|---|---|---|---|
| JP | 2013248402 | A | 12/2013 |
| JP | 2018183525 | A | 11/2018 |
| JP | 2022508337 | A | 1/2022 |
| JP | 2022124633 | A | 8/2022 |

* cited by examiner

*Primary Examiner* — G.M. A Hyder

(57) ABSTRACT

A camera image of a subject placed on a table for subject transport of an imaging apparatus is acquired, and the camera image is used to present an optimal disposition of equipment to be mounted on the subject from the viewpoint of image quality. Next, a camera image of the subject on which the equipment is mounted is used to determine/predict safety, such as whether or not there is a collision or entanglement between the mounted equipment or the like and a structure of the imaging apparatus or the like, and whether or not a clearance with a bore can be maintained even after the mounting, and a result is presented to an operator.

15 Claims, 11 Drawing Sheets

2

IMAGING SUPPORT DEVICE, MAGNETIC RESONANCE IMAGING APPARATUS INCLUDING IMAGING SUPPORT DEVICE, AND IMAGING SUPPORT METHOD

CROSS-REFERENCE TO RELATED APPLICATION

The present application claims priority under 35 U.S.C. § 119 to Japanese Patent Application No. 2023-158720, filed Sep. 22, 2023, the content of which is hereby expressly incorporated by reference, in its entirety, into the present application.

BACKGROUND OF THE INVENTION

1. Field of the Invention

The present invention relates to a support device during subject setup in an imaging space in an imaging apparatus such as a magnetic resonance imaging (MRI) apparatus, and particularly, to a setup support technology including mounting of a receive coil.

2. Description of the Related Art

In an examination using an MRI apparatus, a receive coil for receiving a nuclear magnetic resonance signal is mounted on an examination site of a subject, the examination site of the subject is disposed in an imaging space in which a static magnetic field is generated, and imaging is performed. In order to perform imaging to obtain a good image, it is important that the receive coil is appropriately mounted at an appropriate position of the subject and that the examination site is reliably positioned substantially at a center of the static magnetic field. In addition, the imaging space is formed in a relatively narrow bore, and the subject on which the receive coil is mounted is transported into the narrow bore in a state of lying on a bed. Therefore, it is important to secure a safe transportation operation. That is, it is necessary to proceed with the operation such that no accidents occur, such as the receive coil or a cable thereof mounted on the subject getting caught on other structures during the transport, or the subject hitting an entrance or an inner wall surface of the bore, which may cause falling from a predetermined position of the bed.

Various proposals have been made in order to appropriately perform the setup from the mounting of the receive coil to a magnetic field space. For example, JP2018-183525A discloses a technology of analyzing movements of a subject, equipment used for imaging (a receive coil or the like), an operator, and the like from an image acquired by a camera to monitor whether a series of operations (workflows) are appropriately proceeding, in which safety validity in at least one state is determined, and a warning is issued.

In addition, JP2013-248402A proposes acquiring 3D image data of a subject positioned on a patient table device, acquiring information on the subject, for example, information as to whether the subject or an accessory unit (a receive coil or the like) mounted on the subject protrudes from the patient table device, from a temporal change of the 3D image data, comparing the information with a safety value, and outputting a result.

Further, JP2022-508337A proposes a system that calculates a difference between an artificial image generated by using a generator neural network and optical imaging data and that determines an abnormal event that has occurred during setup in an AI-based manner to issue a warning. The abnormal event is considered to include inappropriate disposition or connection of the coil, occurrence of a cable loop or a body loop that may act as an occurrence source of an induced current, and the like. JP2022-124633A proposes a technology further specialized in detecting a loop during transport.

SUMMARY OF THE INVENTION

An especially important item in an example of the setup operation from the mounting of the receive coil to the transport to the magnetic field space is that the receive coil is mounted at an optimal position of the subject in order to obtain high image quality and that safety is secured in the transport in that state.

In the related art, a state of the subject during transport with the receive coil mounted thereon is monitored, and an abnormality is detected in an AI-based or rule-based manner. However, the safety of the subsequent operation is not determined at a point in time when the receive coil is mounted. That is, in the related art, an abnormal event or inconvenience that has occurred in the progression of a transportation operation can be detected, and measures can be taken against the abnormal event or inconvenience, but in a case in which measures are required, such as returning the subject to a pre-transport state and re-mounting the receive coil, for example, it requires time for the measures, which hinders operational efficiency. In addition, not only from the viewpoint of safety but also from the viewpoint of image quality, the optimal mounting of the receive coil and the use under an optimal condition are not taken into consideration.

An object of the present invention is to provide a technology for determining safety of a subject during a patient setup operation while ensuring image quality of imaging, and allowing an operator to avoid an operation in which safety cannot be ensured.

In order to achieve the above-described object, a receive coil mounting position on a subject before a receive coil is mounted is presented, and a camera image of the subject after the receive coil is mounted is acquired, the acquired camera image is used to determine safety, and a result thereof is presented.

That is, according to an aspect of the present invention, there is provided an imaging support device that supports an operation of setting up a subject in an imaging apparatus including an imaging space and a table on which the subject is placed and which transports the subject to the imaging space, the imaging support device comprising: a camera image acquisition unit that acquires a camera image of the subject placed on the table; an optimal disposition presentation unit that uses the camera image to present an optimal disposition of equipment to be mounted on the subject; and a determination unit that determines safety of the setup operation by using a camera image of the subject on which the equipment is mounted.

A determination result of the determination unit is presented to the operator or fed back to the optimal disposition presentation unit.

According to another aspect of the present invention, there is provided a magnetic resonance imaging apparatus having a function of the imaging support device described above as a function of a calculation unit.

In addition, according to still another aspect of the present invention, there is provided an imaging support method of supporting an operation of setting up a subject in an imaging apparatus including an imaging space and a table on which the subject is placed and which transports the subject to the imaging space, the imaging support method comprising: a camera image acquisition step of acquiring a camera image of the subject placed on the table; an optimal disposition presentation step of using the camera image to present an optimal disposition of equipment to be mounted on the subject; a determination step of determining safety of the setup operation by using a camera image of the subject on which the equipment is mounted; and a result presentation step of presenting a determination result of the determination step.

According to the aspects of the present invention, by disposing equipment, such as a receive coil or a cable connected to the receive coil, at an optimal position with respect to the subject, it is possible to transport and position the subject in a magnetic field space while ensuring image quality of imaging and securing safety. As a result, it is possible to execute the transportation operation without interruption and to improve the efficiency of the operation together with operation safety.

DESCRIPTION OF THE PREFERRED EMBODIMENTS

Hereinafter, embodiments of the imaging support device according to the present invention will be described. In the following description, a case will be described as an example in which an imaging apparatus is an MRI apparatus and equipment mounted on a subject is mainly a receive coil of the MRI apparatus, but the present invention can also be applied to an imaging apparatus that is an apparatus which includes an imaging space and which performs imaging by transporting the subject into the imaging space, for example, a CT apparatus or a PET apparatus, and may also be applied a case in which the equipment is a biological information measurement apparatus such as an oxygen concentration meter or a heart rate monitor.

First, an imaging apparatus that is a target of an imaging support device will be described.

Figure 1A:
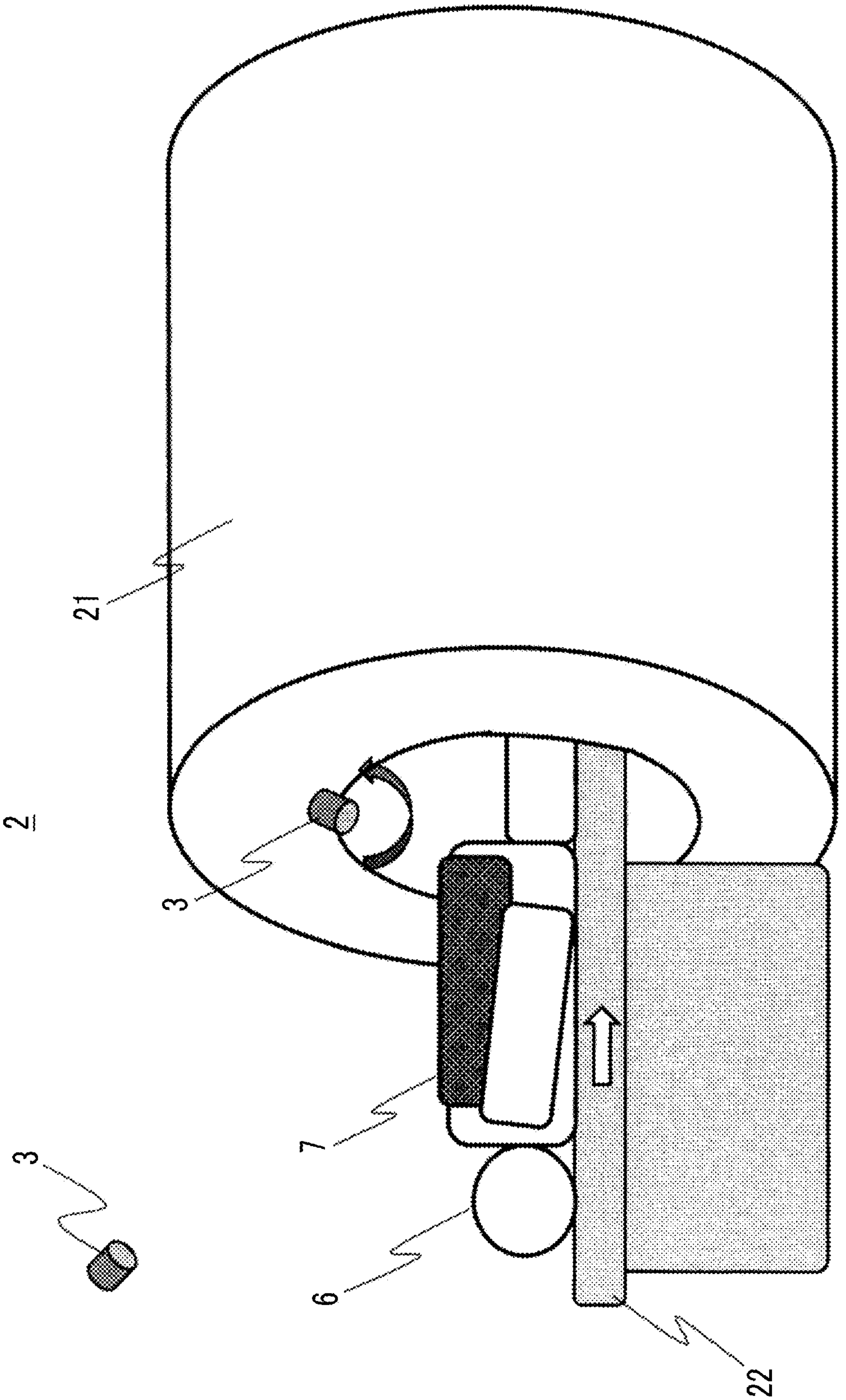
FIG. 1A is a diagram showing an example of an appearance of an imaging apparatus to which the present invention is applied.
Figure 1B:
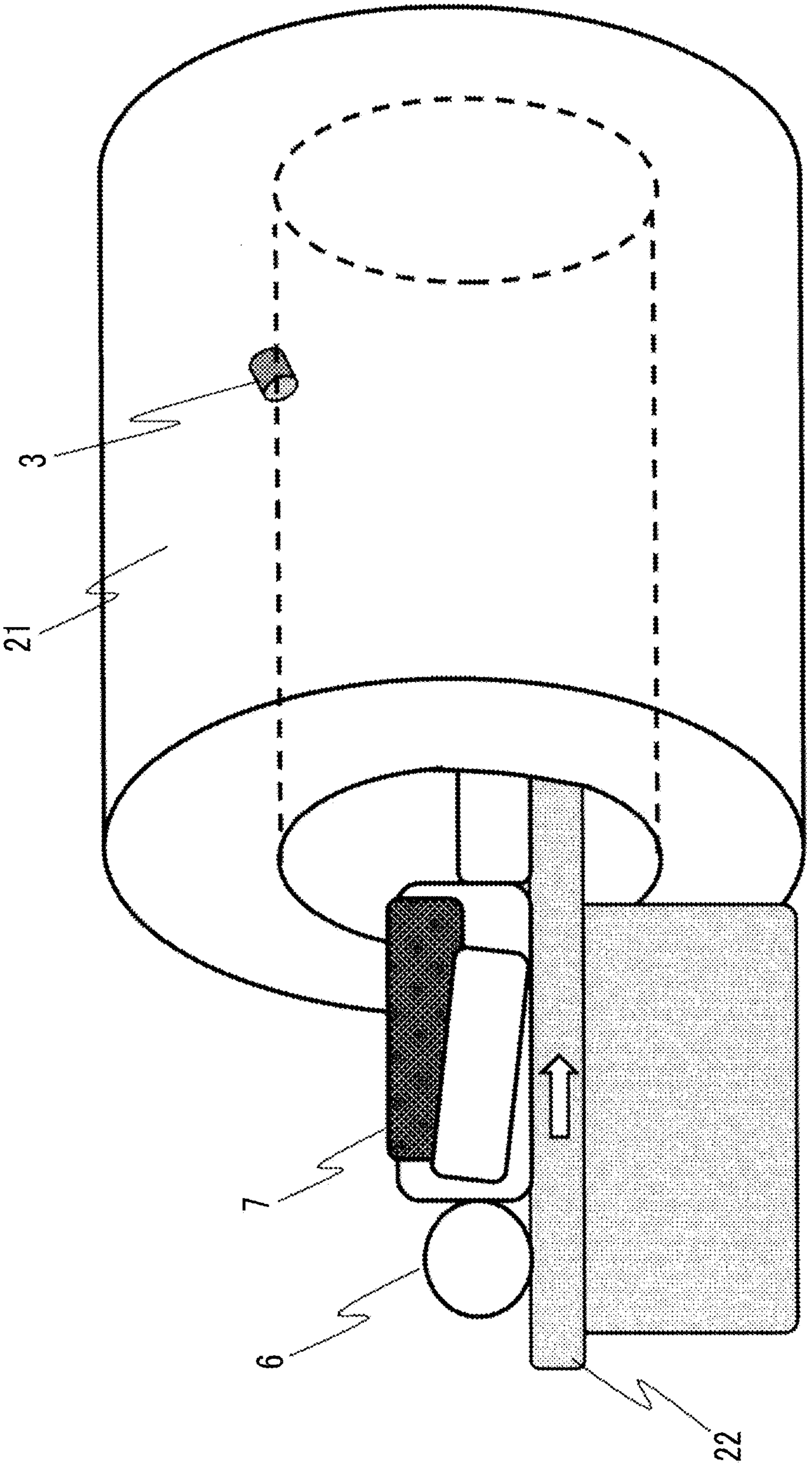
FIG. 1B is a diagram showing another example of the appearance of the imaging apparatus to which the present invention is applied.

FIGS. 1A and 1B show examples of an imaging apparatus 2 to which the present invention can be applied. The imaging apparatus 2 comprises a cylindrical gantry 21 including an imaging space (bore) inside and a patient table device for transporting a subject 6 into the bore. The patient table device comprises a table 22 on which the subject 6 is placed, and the table 22 is moved to transport the subject 6 into the bore.

The imaging apparatus 2 includes one or a plurality of cameras 3 installed at a position where the subject 6 before being transported into the imaging space can be imaged, and acquires a camera image of the subject 6 placed on the table 22 of the patient table device. The type, the number of installation, and the installation position of the camera are not particularly limited. In FIG. 1A, an example is shown in which the camera 3 is installed at two locations, such as in the vicinity of an entrance of the gantry 21 and an upper part of an examination room, that is, a ceiling, but the number of cameras may be one or three or more, and the installation location may be any position as long as the camera image required for the above-described setup can be acquired. In addition, as shown in FIG. 1B, in a case in which the camera 3 installed in the gantry can capture a camera image allowing the setup state on the table to be checked, the image may be used.

Further, the camera 3 may be a camera that acquires a two-dimensional video or may be a stereo camera that enables the grasping of three-dimensional positions. Additionally, a camera having a video function or a tracking function, or the like may be used. Regardless of the type of the camera, an image acquired by the camera will hereinafter be referred to as a camera image. That is, in the present specification, the "camera image" is used in a broad sense to include not only an image acquired by a camera in a narrow sense but also an image acquired by an optical imaging apparatus.

Inside the gantry 21, in a case of the MRI apparatus, a static magnetic field magnet, a gradient magnetic field generation magnet, an RF transmission coil, and the like are disposed in this order, and a uniform static magnetic field generated by the static magnetic field magnet is generated in the imaging space. The RF transmission coil may also serve as an RF receive coil that receives a nuclear magnetic resonance signal generated by the subject, but an RF receive coil 7 is mounted on the subject in order to receive the nuclear magnetic resonance signal with high sensitivity.

Figure 2:
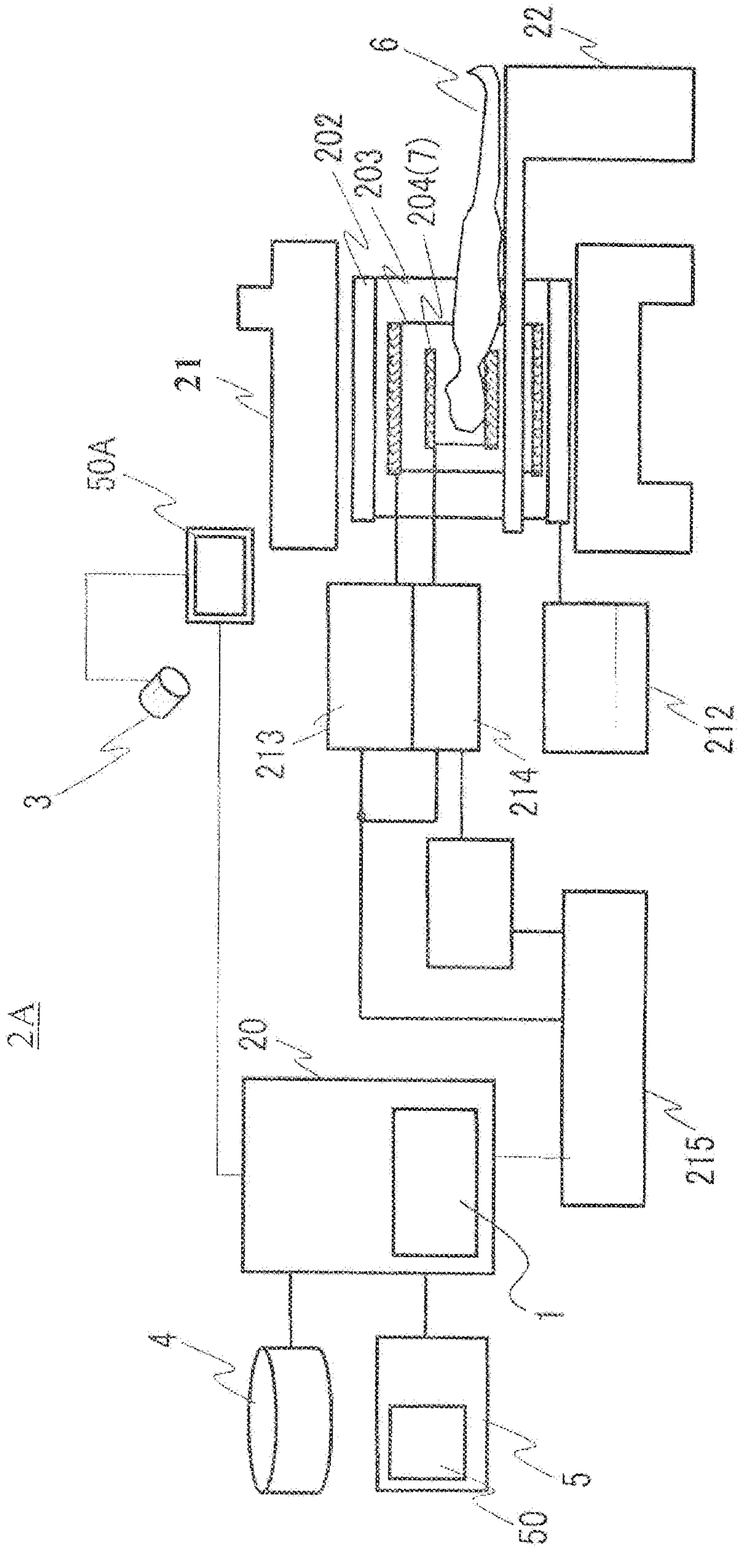
FIG. 2 is a block diagram of an imaging apparatus (MRI).

As shown in FIG. 2, a gradient magnetic field generation magnet 202, an RF transmission coil 203, and an RF receive coil 204 (RF receive coil 7) are connected to a gradient magnetic field power supply 212, an RF transmission unit 213, and an RF reception unit 214. The operations of the gradient magnetic field power supply 212, the RF transmission unit 213, and the RF reception unit 214 are controlled by a sequencer 215 in accordance with a predetermined pulse sequence.

An MRI apparatus 2A further comprises a computer 20 that performs control of the entire apparatus and calculations such as image reconstruction using the nuclear magnetic resonance signal detected by the RF reception unit 214. An external storage device 4 that exchanges data, calculation results, or the like required for the control or calculation of images or a UI unit 5 provided with a device 50 such as a display device is connectable to the computer 20.

Since an imaging procedure by the MRI apparatus 2A is the same as that of a general MRI apparatus, the description thereof will be omitted in the present specification.

An imaging support device 1 is a device that supports a preparation process of placing the subject 6 on the table 22, mounting the receive coil 7 on the subject 6, and transporting the subject 6 to a predetermined position in the imaging space, in a case in which imaging is performed by using such an MRI apparatus 2A. The imaging support device 1 can be constructed in a general-purpose computer or a workstation and may be incorporated into the computer 20 of the MRI apparatus 2A. In addition, it is also possible to implement a part of functions of the imaging support device 1 by using a programmable IC or the like.

Figure 3:
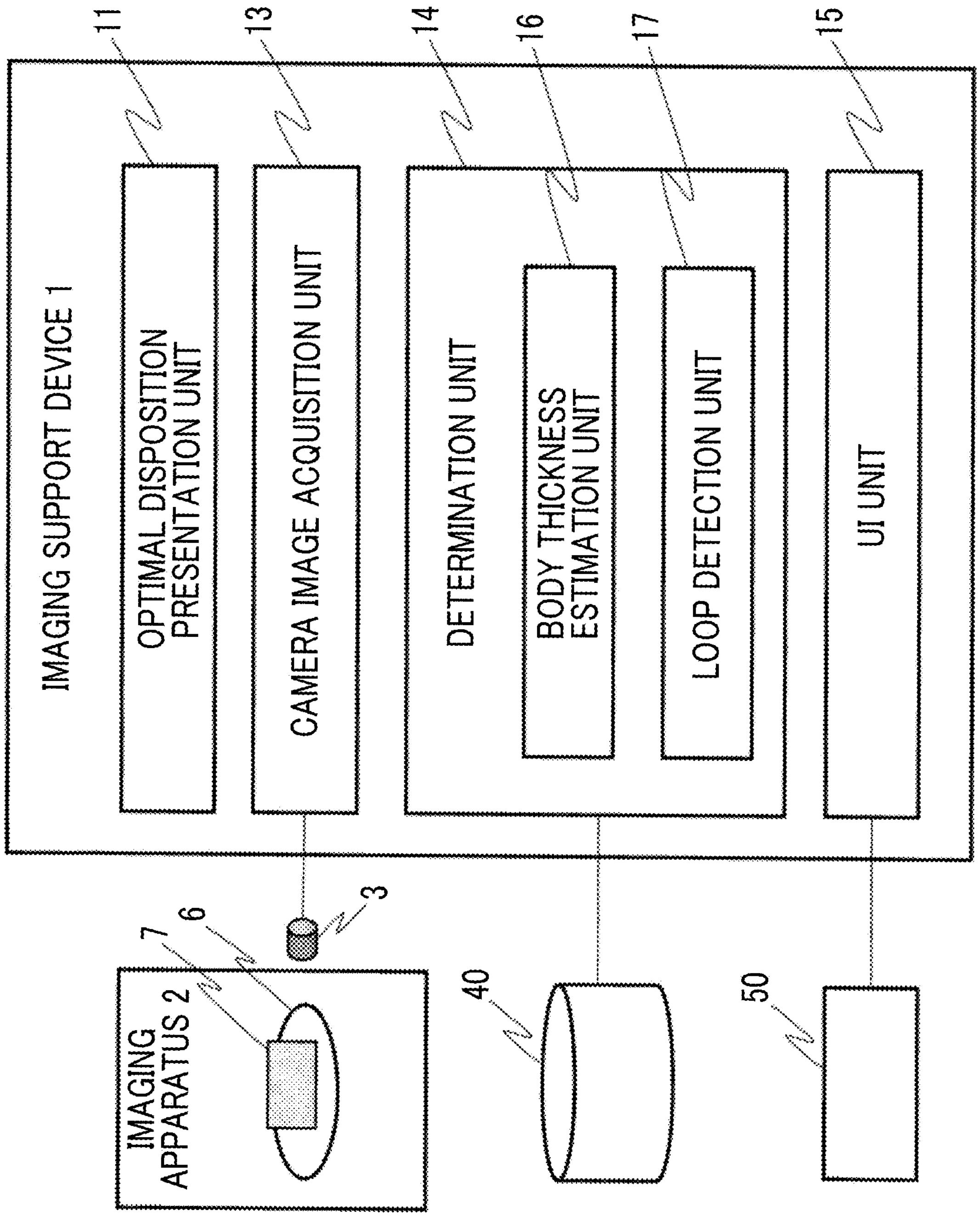
FIG. 3 is a functional block diagram of an imaging support device.

FIG. 3 is a block diagram showing an overview of the functions of the imaging support device 1, and an optimal disposition presentation unit 11 that presents an optimal disposition of the equipment, such as the receive coil 7, to be mounted on the subject 6, a camera image acquisition unit 13 that acquires a camera image of the subject disposed in the imaging apparatus 2, a determination unit 14 that determines operation safety by using the camera image, and another UI unit 15 for exchange with an imaging technician, a doctor, or the like (hereinafter, referred to as an operator) are provided. Further, in some embodiments, a body thickness estimation unit 16 that performs physical measurements or estimations such as a body thickness of the subject, and a loop detection unit 17 that detects a loop occurring in the equipment or the subject are provided.

In addition, to the imaging support device 1, as accessory devices, the camera 3 that is installed in the imaging apparatus 2 at a position where the subject 6 can be imaged, another external storage device 40 that stores data and the like used for the determination of the determination unit 14, and the device 50 connected to the UI unit 15, such as a display device (e.g., 50A in FIG. 2), an input device, and a sound generation device, are connected. In a case in which the imaging support device 1 is incorporated into the computer of the imaging apparatus, such as the MRI apparatus 2A, as shown in FIG. 2, the external storage device 4 and the UI unit 5 connected to the computer 20 shown in FIG. 2 may also serve as the external storage device 40 and the UI unit 15 (including the device 50) shown in FIG. 3.

Although the installation position or the like of the camera 3 has been described in the description of FIGS. 1A and 1B showing the imaging apparatus 2, it is preferable to attach two or more cameras and utilize the cameras as stereo cameras for imaging support. As a result, the body thickness of the subject can be measured, and it is also possible to determine whether a patient having a large physique (large abdominal girth) can fit into the bore in a case in which the patient is to be placed inside the bore.

The camera image acquisition unit 13 acquires the camera image from the camera 3 at a predetermined timing, and passes the camera image to the determination unit 14 and displays the camera image on the display device of the UI unit 15. The timing at which the camera image acquisition unit 13 acquires the camera image may be a timing at which the operator issues an instruction via the UI unit 15, or may be automatically acquired at a constant interval or at a predetermined timing programmed in advance.

Figure 4:
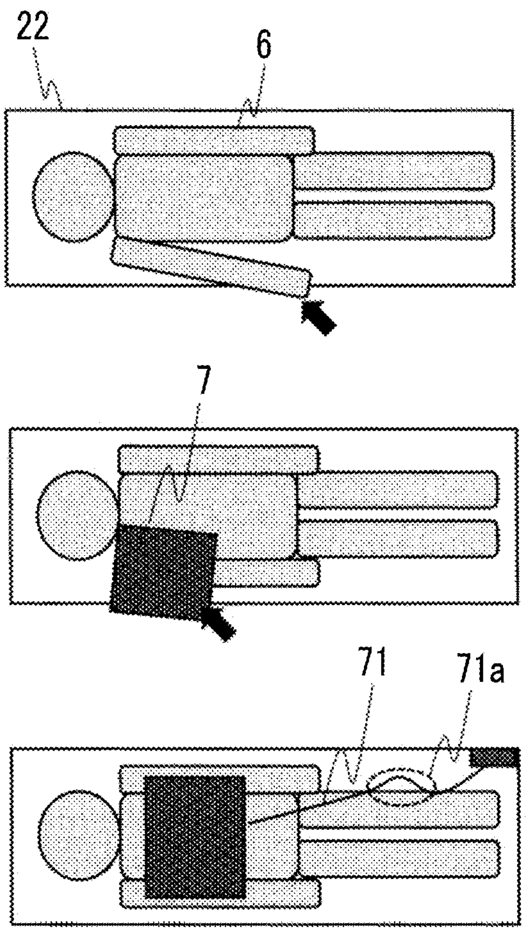
FIG. 4 is a diagram showing an example of a safety check during transport.

The determination unit 14 analyzes the camera image of the subject 6 on which the receive coil 7 is mounted, and determines whether or not the safety in a case in which subject 6 with the receive coil 7 mounted thereon is transported into the bore is secured. The camera image of the subject before the receive coil is mounted is also acquired as necessary. States in which safety becomes a problem include: for example, as shown in FIG. 4, a state in which a part of a body of the subject 6, the receive coil 7 mounted on the subject 6, a blanket covering the subject 6, or the like protrudes from the table 22 on which the subject 6 is placed; a state in which the receive coil 7, the blanket, or the like may be potentially entangled in the table in a case in which the subject 6 is transported into the gantry 21 of the imaging apparatus 2 in a state in which the receive coil 7 is mounted; a state in which a predetermined distance (clearance) is not maintained between an inner wall surface of the bore and a transported object; and a state in which a loop that provides a path for an induced current is formed or may be potentially formed in a cable (not shown) connected to the subject 6 or the receive coil 7.

The optimal disposition presentation unit 11 determines the optimal position at which the receive coil should be mounted from the viewpoint of the image quality, for example, based on the camera image of the subject before the receive coil is mounted and examination information of the subject, and presents the optimal position on the camera image appearing on the display device of the UI unit 15. Details of a determination method of the position by the optimal disposition presentation unit 11 will be described below.

Next, the embodiment of processing of each unit will be described based on the configuration of the imaging support device 1 described above.

Embodiment 1

In the present embodiment, basic processing of the imaging support device 1 will be described with reference to the flow shown in FIG. 5. Here, it is assumed that the camera 3 continuously performs imaging at predetermined intervals.

The camera image acquisition unit 13 acquires the camera image captured by the camera 3 in a state in which the subject 6 is placed on the table 22 of the patient table device (S1). The camera image deviates from the actual distance and position relationship in the subject depending on the position where the camera 3 is disposed, but it is also possible to calibrate the camera image by using information on a distance or an angle between the camera and the subject, or the like, and the image after the calibration may be used as the camera image.

The optimal disposition presentation unit 11 determines a position at which the receive coil 7 should be mounted on the subject 6, based on the examination information input via the imaging apparatus 2 or the UI unit 15, and displays the position on the camera image displayed on the display device of the UI unit 15 (S2).

A method of determining and presenting the optimal disposition of the receive coil from the viewpoint of the image quality is not limited, but for example, in a case in which a user designates an examination site, for example, a position of the heart, on the camera image displayed on the display device, a position where the center of the receive coil coincides with the center of that position is determined as the optimal disposition, and the optimal disposition is presented on the camera image. Alternatively, the examination site of the subject is irradiated with projection light from a projector provided in the imaging apparatus, and the position of the receive coil is presented on the camera image such that the center of the receive coil coincides with that position. In this case, receive coil information including the type, the size, and the shape of the receive coil may be stored in advance in the external storage device 4, and then the stored information may be read out for a receive coil used for actual imaging, and an appropriately scaled figure of a contour of the receive coil is disposed on the camera image, thereby displaying the position on the camera image. In addition, simply, a template image showing an optimal mounting site where the image quality is taken into consideration may be prepared in advance for each examination site, and then imaging information including the examination site may be acquired from the imaging apparatus 2, and the template image may be presented.

The camera image acquisition unit 13 acquires the camera image captured by the camera after the receive coil is mounted, from the camera image captured by the camera 3 in a continuous manner or at predetermined intervals, and passes the acquired camera image to the determination unit 14 (S3). A timing at which the camera image after the receive coil is mounted is acquired or passed to the determination unit 14 may be determined by the user via the input device or the like of the UI unit 15, or a timing at which the receive coil 7 is connected to the imaging apparatus 2 (receiver) may be received from the imaging apparatus 2 and may be used as the timing of the camera image acquisition.

The determination unit 14 analyzes the camera image in a state in which the receive coil is mounted on the subject and checks the safety. For example, as shown in FIG. 4, it is checked whether or not a part of the body of the subject 6, or the receive coil 7 or an accessory part mounted on the subject 6 protrudes from the table 22 (Case 1), whether or not a loop 71*a* is formed or may be potentially formed in a cable 71 of the receive coil 7 itself or between the cable 71 and the subject 6 (Case 2), and whether a sufficient gap (clearance) is secured between the receive coil 7 or the subject 6 covered with the blanket or the like, and the imaging space (the inner wall surface of the bore) (Case 3) (S4).

The protrusion from the table 22 can be determined, for example, based on a difference from an image of only the table acquired in advance as a reference image.

By determining the protrusion of the receive coil 7 or the accessory part thereof in this way, it is possible to prevent a remaining coil portion from being entangled in the structure of the imaging apparatus, such as the patient table device, because of the movement of the subject in a case in which the receive coil is wound around the limbs or the like.

For loop formation, in a case in which the loop occurs at a point in time when the receive coil is disposed, the loop detection unit 17 can determine the presence or absence of a loop-shaped figure by performing image processing on the camera image. For the loop that may potentially occur during the transport, the determination unit 14 predicts the occurrence of the loop as the table 22 moves, based on a traveling state of the cable 71 between the receive coil 7 and a receive coil connection portion 72. For example, in a case in which the cable 71 that is led out of the receive coil 7 is disposed along a body axis direction of the subject 6, and is gently bent in the vicinity of the connection portion 72 and connected to the connection portion 72, there is a lower possibility of a loop occurring between the subject 6 and the cable 71 even in a case in which the table 22 moves, but in a case in which the cable 71 is disposed to deviate from the subject 6, the loop is likely to be formed as the table 22 moves, and in some cases, there is also a possibility of protrusion from the table 22. That is, for a cable having a predetermined length from a cable connected portion of the receive coil 7, by detecting the length or the angle with respect to a table movement direction, it is possible to predict the likelihood of loop occurrence. The determination unit 14 detects a distance between the cable connected portion and a table end part, the length of the cable, an angle of the cable traveling, and the like from the camera image, predicts the loop occurrence based on the result, and checks the safety.

By detecting geometric information of the cable during the disposition of the receive coil in this way and predicting the subsequent change, it is possible to preemptively perform detection and issue a warning against the loop occurrence and risks such as the cable being wound around a part of the subject, for example, an arm.

Whether or not the clearance is sufficiently maintained is determined by comparing the result of actually measuring or estimating the size (body thickness or abdominal girth) of the subject or the subject after the equipment or the like is mounted with the size of the bore, which will be described in detail in Embodiment 2.

It is preferable that the determination unit 14 checks the safety by detecting a cable of an SPO2 sensor attached to a finger of the patient or a blanket placed on the patient, in addition to the safety check regarding the patient position, the coil position, and the cable (Case 1 to Case 3). In particular, a thin blanket or the like may be entangled in the table and a support portion thereof during table movement. For the concern of such entanglement, the determination unit 14 can predict the occurrence of entanglement by detecting the blanket and determining the placement status of the blanket, for example, whether or not the blanket position is within a predetermined range, whereby it is possible to prevent the entanglement.

In addition, the above-described prediction is to determine conditions that inhibit the safety in a rule-based manner, but it is also possible to perform the prediction using a machine learning model or AI that has learned various pieces of image data that inhibit the safety. That is, a part or all of the determination unit 14 can also be constructed by using a machine learning model or AI.

In a case in which it is determined that there is a problem in the safety as a result of the determination (in a case of NG determination in S4), the determination unit 14 issues an alert via the UI unit 15 (S5). The alert may be displayed on, for example, a gantry monitor installed at an entrance of the bore as OK or NG from the viewpoint of safety, or a notification may be issued with an alert sound. Further, as the alert display, for example, a problematic area may be indicated by being surrounded by an arrow or a square on the camera image displayed on the display device. Alternatively, an icon, a template image, or the like may be displayed. As a result, the user can immediately recognize the problematic area and can take measures against the problematic area.

After the user takes measures against the area where there is a problem in the safety in response to the alert, the camera image acquisition unit 13 acquires the camera image again (S6). For example, in a case in which there is a problem with the position of the receive coil, the user takes measures such as re-disposing the receive coil while maintaining the initially presented optimal disposition as much as possible.

The camera image acquisition unit 13 passes the camera image after measures are taken against the problematic area (for example, after the receive coil is re-disposed) to the determination unit 14 and repeats the processing S4 to S6 until it is checked that there is no problem in safety.

After that, the table 22 is moved to transport the subject 6 into the imaging space such that the center of the receive coil 7 is located at the center of the bore, that is, the center of the static magnetic field space. Although not shown in FIG. 5, the camera image is also acquired during the transport, and it is monitored whether or not any problem arises due to movements that have occurred during the transport.

As described above, according to the present embodiment, by transporting the subject 6 into the imaging space by ensuring safety in a state in which the receive coil 7 is mounted at the optimal disposition in which the image quality is taken into consideration, it is possible to secure the safety in the setup operation while ensuring the image quality, and it is possible to eliminate the need to repeatedly move the table, and to prevent the inappropriate disposition caused by re-mounting of the receive coil, image quality degradation due to the inappropriate disposition, and the like.

Embodiment 2

In the present embodiment, an imaging support device provided with a function of determining whether a sufficient clearance is secured between the subject 6 covered with the receive coil 7, the blanket, or the like and the imaging space (the inner wall surface of the bore) will be described particularly as a safety check matter.

The imaging support device 1 of the present embodiment comprises the body thickness estimation unit 16 in order to perform the determination, and the body thickness estimation unit 16 estimates the body thickness (a thickness in a direction perpendicular to a table surface) of the subject 6 from the camera image. A functional block diagram of the device of the embodiment is the same as that of FIG. 3.

Figure 5:
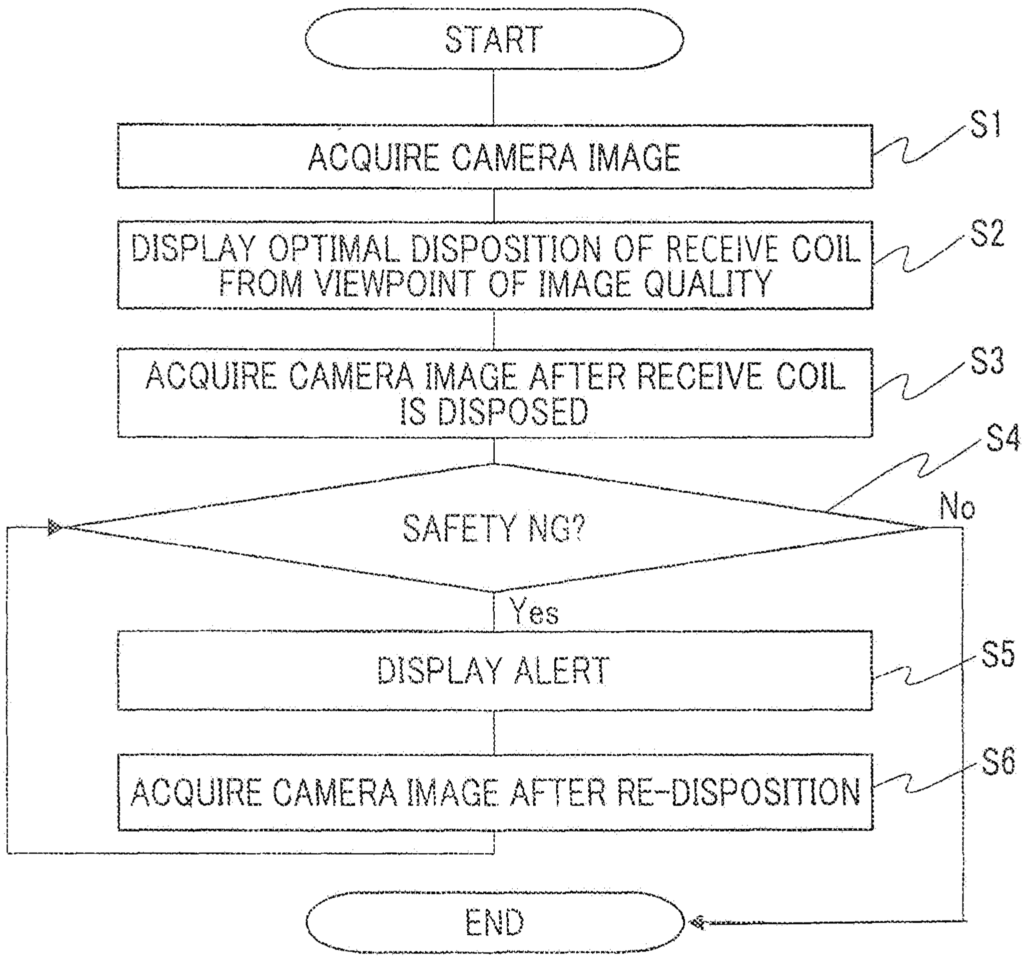
FIG. 5 is a diagram illustrating a flow of processing of the imaging support device of Embodiment 1.
Figure 6:
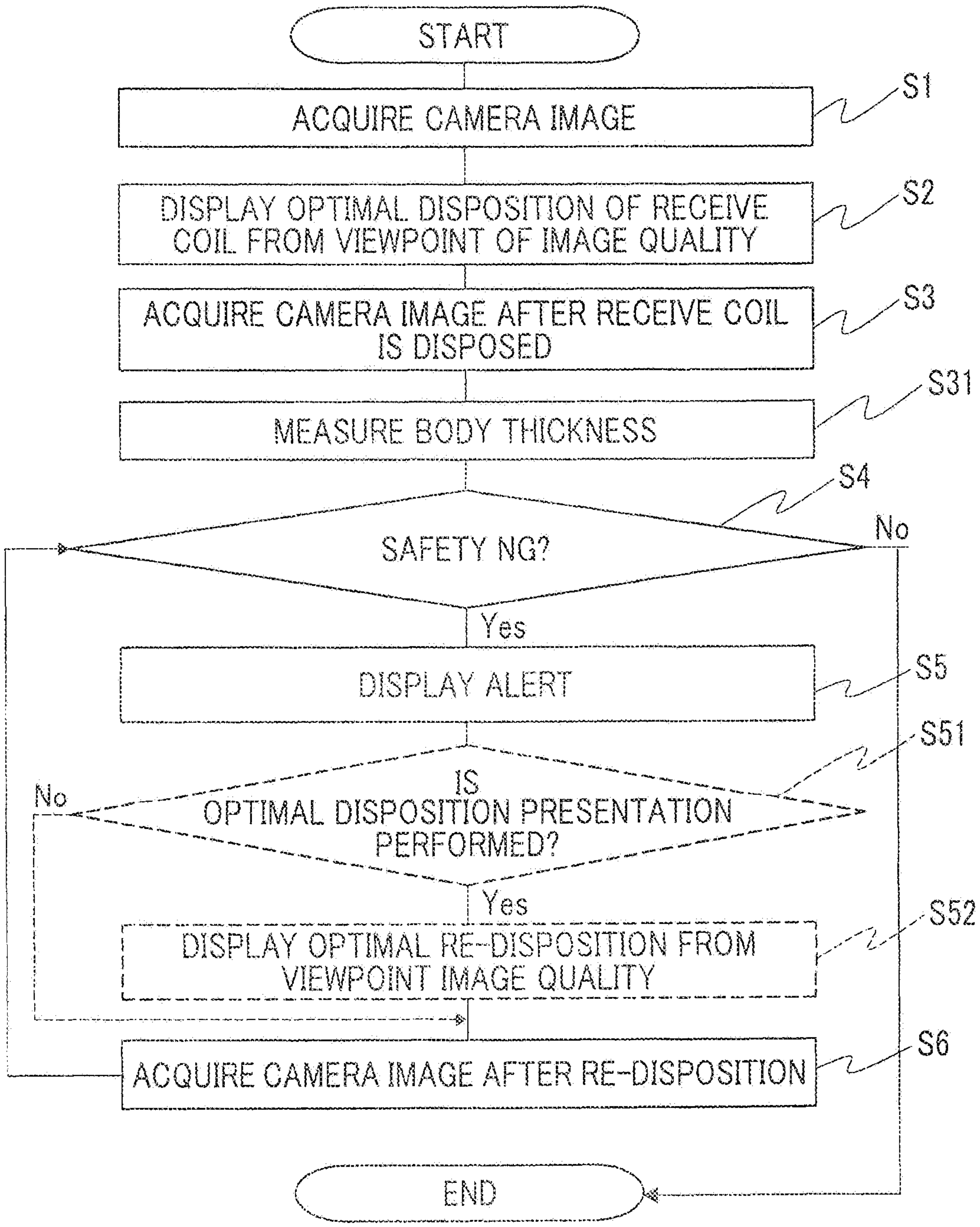
FIG. 6 is a diagram illustrating a flow of processing of an imaging support device of Embodiment 2.

FIG. 6 shows a flow of processing of the present embodiment. In FIG. 6, the same processing as that in FIG. 5 is designated by the same reference numeral, overlapping descriptions will be omitted, and descriptions will be provided with a focus on different points.

First, the optimal disposition presentation unit 11 presents the optimal disposition of the receive coil by using the camera image (S1, S2), and the camera image acquisition unit 13 acquires the camera image after the receive coil is mounted (S3). The body thickness estimation unit 16 estimates the body thickness by using the camera image (S31).

In a case in which the camera 3 is provided beside the patient table, a side surface of the subject appears in the camera image, so that the height of the subject in the perpendicular direction, that is, the body thickness of the subject, can be estimated from the image. Alternatively, in a case in which the camera 3 is a stereo camera, the body thickness of the subject can be estimated from two camera images captured in directions with different angles.

The determination unit 14 determines the sum of the body thickness estimated by the body thickness estimation unit 16 and the thickness of the receive coil 7 acquired in advance as the thickness of the examination target, calculates a difference between a geometric numerical value (the elliptical shape, the height, and the width) of the imaging space and the thickness, and determines whether the difference is within an allowable clearance (S4). An appropriate range of the clearance is determined in advance for each apparatus in consideration of the intensity of the magnetic field generated by the RF transmission coil stored in the gantry, and for example, the determination unit 14 acquires the clearance from the external storage device 4 or the imaging apparatus 2.

Figure 7:
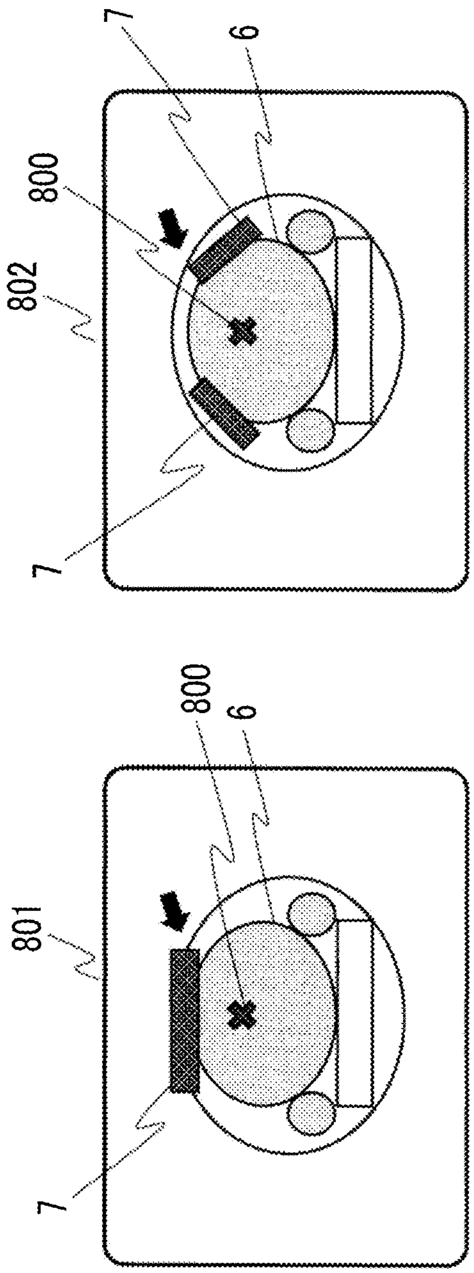
FIG. 7 is a diagram showing a disposition example with an insufficient clearance and a re-disposition example after improvement.

The determination unit 14 issues the alert in a case in which it is determined that the distance between the examination target and the inner wall surface of the bore does not satisfy a predetermined clearance based on the result estimated by the body thickness estimation unit 16 (S5), which is the same as in the flow of FIG. 5, but it is preferable that the alert may be displayed to notify the user not only whether the safety is NG or OK but also that the clearance is not satisfied, as the alert display. For example, a template image 801 as shown in FIG. 7 or text information may be displayed. As a result, the user can take measures against the problematic area in a focused manner.

In a case in which the user re-disposes the receive coil after the alert is issued, the camera image is acquired (S6), and steps S4 to S6 are repeated.

In that case, as indicated by dotted lines in the flow of FIG. 6, the optimal disposition presentation unit 11 may present the optimal disposition of the receive coil (S52) according to the determination result of the determination unit 14 (S51). For example, as shown in FIG. 7, in a case in which the clearance between the upper surface of the inner wall of the gantry and the receive coil 7 is extremely small due to the mounting of the receive coil 7 (801), the disposition or the type of the receive coil 7 that can avoid the contact between the upper surface and the receive coil and that can maintain good reception sensitivity with respect to an examination site 800 is presented (802). As the presentation method, the presentation using the image (the template image or the displayed camera image) may be used, or text information indicating the type of the receive coil, and the like may be used in combination.

As a result, the receive coil can be mounted on the user while securing the safety and ensuring the image quality.

Although a case has been described in FIG. 6 in which the body thickness of the subject 6 is a problem, there is also a possibility that a clearance with the inner side surface of the bore may be a problem depending on the physique or the posture of the subject in addition to the body thickness. In this case as well, a maximum height or a maximum width of a volume occupied by the subject is estimated from the image acquired by the camera provided near the ceiling of the examination room, or the maximum height or the maximum width is obtained from the measurement result performed in advance, thereby performing the determination. In this case, the same processing is performed except that the "body thickness estimation unit" in FIG. 3 is replaced with a "body volume estimation unit".

According to the present embodiment, it is possible to determine whether a patient having a large physique (large abdominal circumference) can fit into the bore in a case in which the patient is to be placed inside the bore. Further, it is possible to preemptively determine a safety inhibiting condition after the disposition of the equipment or the like, which is difficult to determine at a glance, and then it is possible to find the optimal disposition of the receive coil. As a result, it is possible to prevent the discomfort of the subject due to the insufficient clearance or, in extreme cases, the influence on the subject caused by extremely close distance to the RF transmission coil.

Embodiment 3

In Embodiments 1 and 2, a case has been described in which the processes from the determination step S4 to the camera image acquisition step S6 after the receive coil is re-disposed are repeated until the determination unit 14 determines that there is no problem in safety, but the present embodiment provides a method for efficiently performing the setup by limiting the number of repetitions to an appropriate range.

Figure 8:
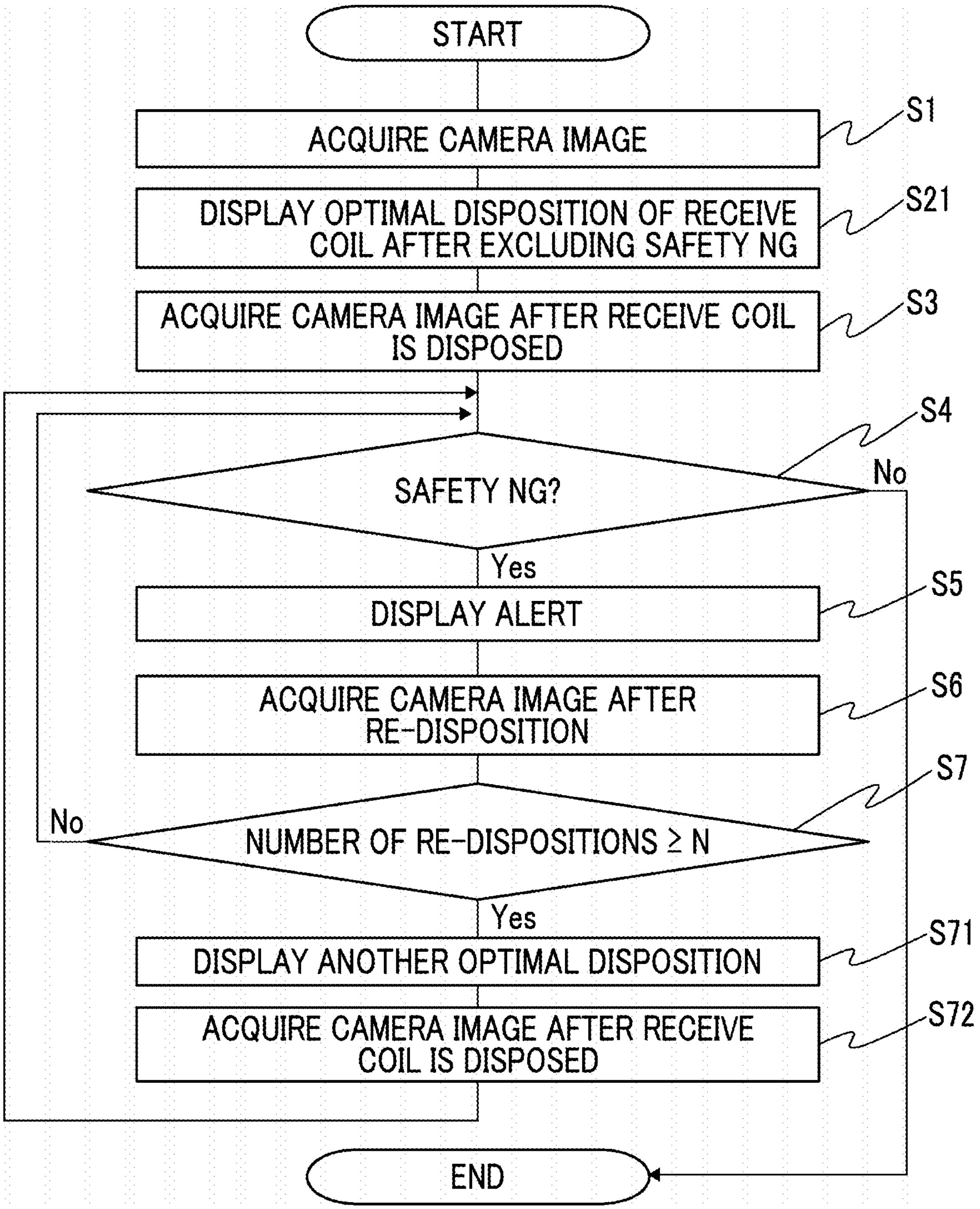
FIG. 8 is a diagram illustrating a flow of processing of an imaging support device of Embodiment 3.

Therefore, in the imaging support device 1 of the present embodiment, the determination unit 14 counts the number of repetitions, and the optimal disposition presentation unit 11 presents an option of the disposition of the receive coil different from the initially presented disposition of the receive coil. Since the configuration of the device is the same as that of the other embodiments, the processing of the imaging support device 1 of the present embodiment will be described with reference to the flow of FIG. 8 below. In FIG. 8, steps having the same contents as those in the steps shown in FIGS. 5 and 6 are designated by the same reference numerals, and overlapping descriptions will be omitted.

After the camera image is acquired (S1), the optimal disposition presentation unit 11 presents the optimal disposition of the receive coil by using the camera image (S21). This step S21 is basically the same as step S2 of Embodiments 1 and 2, but here, a mounting position is presented after excluding a setup position where there is a problem from the viewpoint of safety. For example, in a case in which the examination site is shifted from the center of the subject in a left-right direction, such as the heart or one of the arms or legs, or in a case where the examination site is spread out, setting up the receive coil such that the center of the receive coil is located at the center of the examination site may potentially cause the receive coil to protrude from the table end part with a multi-channel coil having a relatively wide area. The optimal disposition presentation unit 11, for example, compares the position or the range of the examination site specified in the camera image with the size of the receive coil and presents the optimal position of the receive coil by excluding the setup position where the receive coil protrudes from the table.

The exclusion of the safety NG in this step may be simpler than the safety determination by the determination unit 14, but by excluding the disposition with the safety problem that can be easily predicted in advance, the number of repetitions of the subsequent safety determination loop can be reduced.

After the receive coil is mounted on the user in accordance with the presented position of the receive coil, the determination unit 14 acquires the camera image after the mounting (S3) and determines whether or not the safety is maintained (S4). In a case in which the safety is NG, the alert display (S5) and the acquisition of the camera image after the receive coil is re-disposed (S6) are performed, and the safety is determined again (S4). However, the determination unit 14 monitors the number of times the safety determination is repeated, that is, the number of times the re-disposition is repeated (S7), stops the determination loop in a case in which the number of times is equal to or greater than a predetermined number of times (N), and causes the optimal disposition presentation unit 11 to present a second option (S71). The second option is a disposition in which equivalent image quality to the initially presented optimal disposition of the receive coil or relatively higher image quality in terms of the image quality can be ensured, and includes the use of the receive coils with different types and the dispositions thereof.

For example, in a case in which the alert persists even after repeated re-dispositions for a patient with a large body type because the initially presented disposition may be optimal from the viewpoint of the image quality but the patient can be barely disposed due to the distance between the patient and the bore, as shown in FIG. 7, the coil position is changed or another receive coil is selected to present the disposition as the second optimal disposition.

In a case in which the receive coil is disposed in the presented second optimal disposition, the camera image acquisition unit 13 acquires the camera image (S72), and steps S4 to S7 described above are repeated again.

According to the present embodiment, there is no need to repeatedly perform one optimal disposition operation proposed in terms of the image quality, thereby allowing for efficient operation. Although not shown in FIG. 8, it is also possible to accept a user instruction as to whether or not to stop the imaging after step S7 of determining the number of re-dispositions. As a result, in a case in which the safety cannot be secured only by the disposition of the equipment or the subject, the user may be prompted to reconsider the imaging method.

Embodiment 4

The present embodiment is an embodiment in which, in a case in which the receive coil is the multi-channel coil, a function of presenting the optimal coil position for improving the image quality, in addition to the mounting position of the receive coil, is added to the optimal disposition presentation unit 11.

A receive coil that is currently widely used in the MRI apparatus is a multi-channel coil in which a large number of surface coils are disposed in order to enhance sensitivity and enable wide-range imaging. The multi-channel coil has an advantage that a relatively wide region can be imaged at high sensitivity at once, but in a case of imaging a limited examination site, there is also a possibility that noise may be increased because a signal from a coil of a channel located at a position relatively far from the site is also included in the image reconstruction. In addition, in the multi-channel coil, there is also a coil having a large number of channels as compared with receiver channels of the receive coil of the imaging apparatus 2, and in this case, it is necessary to select which channel to use or not to use.

In the imaging support device 1 of the present embodiment, in a case in which the multi-channel coil is used, a function of presenting one or a plurality of optimal channels in terms of the image quality among the large number of channels constituting the multi-channel coil is added. The channel presentation function may be a function of the optimal disposition presentation unit 11 shown in FIG. 3, or a channel presentation unit (not shown) may be provided separately. Here, description will be provided by replacing the optimal disposition presentation unit 11 in FIG. 3 with the channel presentation unit. Other configurations and functions of the determination unit 14 are the same as those in the above-described embodiment. Hereinafter, the present embodiment will be described with a focus on different points.

Figure 9:
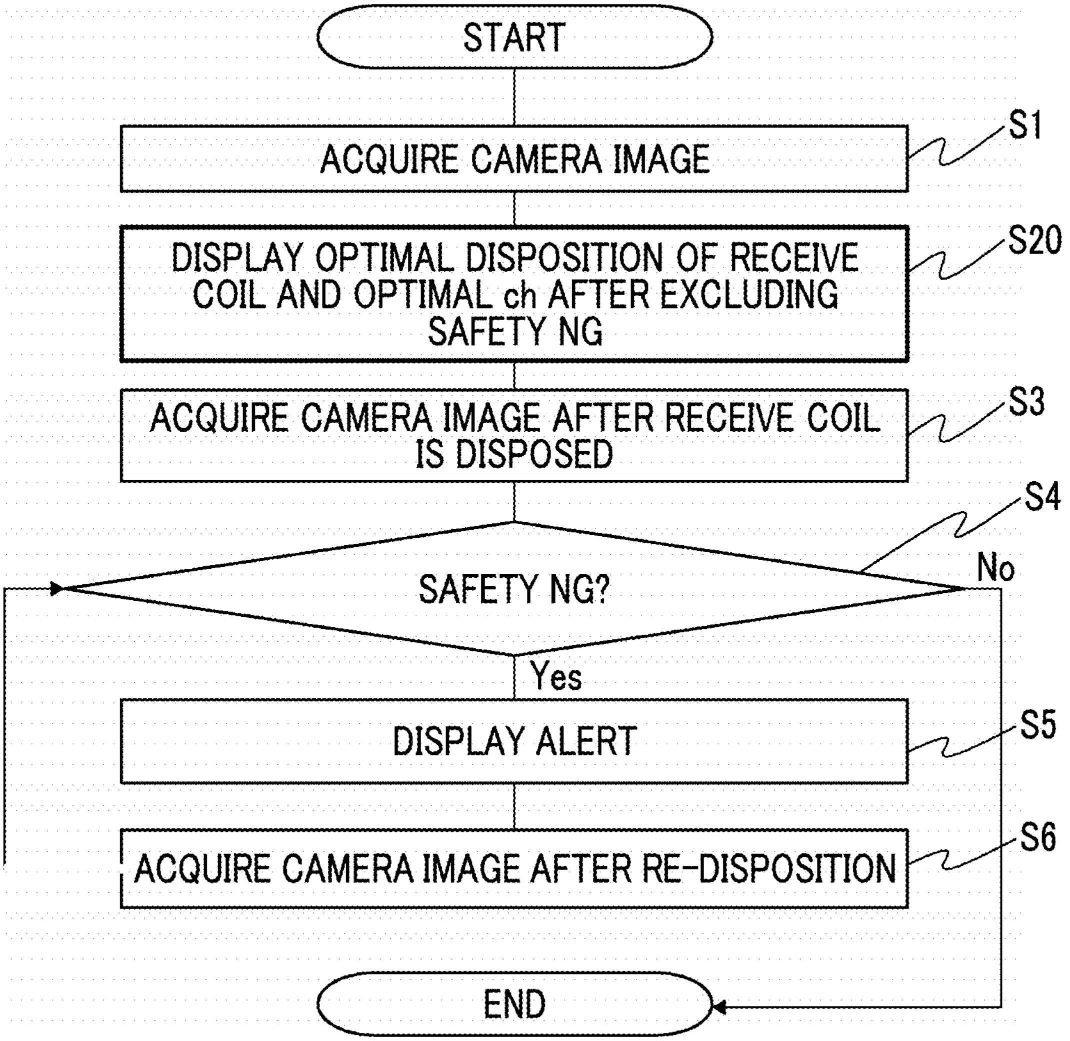
FIG. 9 is a diagram illustrating a flow of processing of an imaging support device of Embodiment 4.

FIG. 9 is a flow showing processing of the imaging support device of the present embodiment, and the flow is the same as the flow of Embodiment 1, except that step S2 of the flow of Embodiment 1 shown in FIG. 5 is replaced with step S20.

In step S20, first, the optimal disposition presentation unit 11 presents the optimal position of the receive coil from the viewpoint of the image quality. In that case, the optimal disposition is presented after excluding the setup position with a problem from the viewpoint of safety. This processing is the same as that in step S21 of FIG. 8, and the optimal disposition is simply determined and presented, for example, by excluding a disposition in which the receive coil protrudes from the table by using the camera image. In the optimal position presented in this way, the center of the receive coil does not always coincide with the center of the examination site. In order to obtain high image quality, it is important to perform the reconstruction by using signals received by channels in a predetermined range centered on the examination site.

Figure 10:
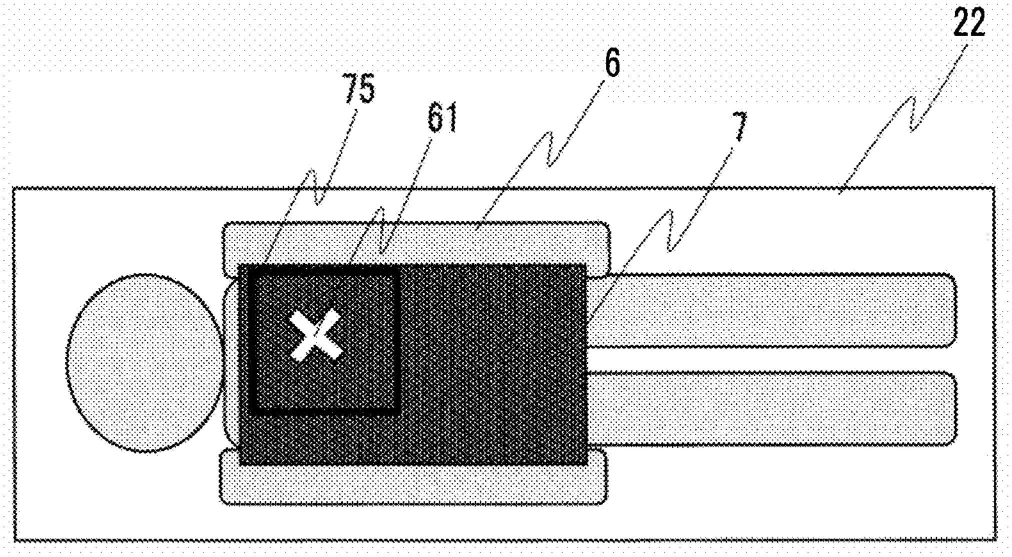
FIG. 10 is a diagram showing an optimal channel presentation example by the imaging support device of Embodiment 4.

In that respect, the channel presentation unit selects channels within a predetermined region including the examination site among the plurality of channels of the receive coil as active channels. FIG. 10 shows an example in which an examination site 61 is located on a left side of the chest of the subject 6 as an example, and the optimal position of the receive coil and the optimal channel position excluding safety NG are presented. This example is an example in which a multi-channel coil that can image the trunk part of the subject 6 is used, and the examination site 61 of the subject 6 is biased to the left side. Therefore, a position that does not protrude from the table, where the center of the receive coil is shifted from the center of the examination site, is presented as the optimal position, and a certain region including the examination site 61 and centered on the examination site 61 is presented. The channel included in the certain region is the optimal channel. Although the range of the optimal channel is presented here, conversely, an unused channel may be presented.

Information indicating the optimal channel is reflected in the imaging apparatus 2. As the reflection method, for example, the user may perform a setting of manually activating the channel by using the presented information on the optimal channel, or the information indicating the optimal channel is sent to the imaging apparatus 2 together with the geometry information of the multi-channel coil and the optimal channel automatically selected on an imaging apparatus 2 side may be turned ON.

As described above, presenting the optimal position of the receive coil and the optimal channel in step S20 and then acquiring the camera image after the mounting, predicting the safety, and issuing the alert as necessary (S4 to S6) are the same as those in other embodiments, and the description thereof will be omitted. In the present embodiment as well, as in the flow of FIG. 8, a step of reducing the safety determination cycle may be added, and a second option for the optimal disposition may be presented as necessary. In a case in which the optimal disposition is changed, the presentation of the optimal channel is also changed as necessary.

According to the present embodiment, it is possible to ensure high image quality and support safe setup by presenting the optimal channel in addition to the optimal mounting position.

Although embodiments have been described above in which the imaging support device and the imaging support method of the embodiment of the present invention are mainly applied to the MRI, the present invention can be applied not only to the MRI apparatus but also to an apparatus that transports the subject into a bore and that performs imaging. In addition, the individual embodiments or the individual processing included in the individual embodiments can also be appropriately combined as long as there is no technical contradiction, and such a combination is also included in the present invention.

EXPLANATION OF REFERENCES

1: imaging support device
2: imaging apparatus
2A: MRI apparatus
3: camera
50: device (display device and input device)
6: subject
7: equipment (receive coil)
11: optimal disposition presentation unit
13: camera image acquisition unit
14: determination unit
5, 15: UI unit
16: body thickness estimation unit
17: loop detection unit
21: gantry
22: table
71: cable

What is claimed is:

1. An imaging support device that supports an operation of setting up a subject in an imaging apparatus including an imaging space and a table on which the subject is placed and which transports the subject to the imaging space, the imaging support device comprising:

a camera image acquisition unit that acquires a camera image of the subject placed on the table;

an optimal disposition presentation unit that uses the camera image to present an optimal disposition of equipment to be mounted on the subject; and a determination unit that determines safety during the setup operation by using a camera image of the subject on which the equipment is mounted, wherein the equipment is a receive coil used in a magnetic resonance imaging apparatus, and the optimal disposition presentation unit presents a disposition position of the receive coil for obtaining high image quality for an examination site of the subject, as the optimal disposition, and wherein the receive coil is a multi-channel coil consisting of a plurality of channels, and the optimal disposition presentation unit includes a channel presentation unit that presents some channels from the plurality of channels as optimal channels for obtaining high image quality.

2. The imaging support device according to claim 1, wherein the determination unit determines whether or not a gap between the subject on which the equipment is mounted and an inner wall surface of the imaging space satisfies a predetermined value.

3. The imaging support device according to claim 2, further comprising:

a body thickness estimation unit that estimates a body thickness of the subject, wherein the determination unit performs the determination by using the body thickness estimated by the body thickness estimation unit.

4. The imaging support device according to claim 1, wherein the determination unit predicts entanglement of an accessory associated with the subject or the equipment during transport of the subject into the imaging space.

5. The imaging support device according to claim 1, wherein the determination unit predicts whether or not a loop occurs between the equipment and a cable connected to the equipment or between the cable and the subject.

6. The imaging support device according to claim 5, wherein the determination unit predicts the occurrence of the loop by using geometric information of the cable including a length of the cable and a connection angle with respect to the equipment, which are obtained from the camera image.

7. The imaging support device according to claim 1, wherein the determination unit performs the determination by using a learning model that has learned a disposition of the equipment and an accessory on the subject and a change in the disposition after movement of the subject.

8. The imaging support device according to claim 1, wherein the optimal disposition presentation unit presents a disposition that excludes a disposition in which safety of the setup is not ensured, as the optimal disposition.

9. The imaging support device according to claim 1, wherein the optimal disposition presented by the optimal disposition presentation unit includes any of a position, a type, or the number of the receive coil.

10. The imaging support device according to claim 1, further comprising:

a user interface unit that issues an alert according to a determination result of the determination unit.

11. The imaging support device according to claim 1, wherein the optimal disposition presentation unit presents a second optimal disposition different from the optimal disposition according to a determination result of the determination unit.

12. A magnetic resonance imaging apparatus comprising:

an imaging unit including an imaging space in which a static magnetic field is generated, a table that transports a subject to the imaging space, an RF transmission unit that generates an RF magnetic field in the imaging space, and an RF reception unit that receives a nuclear magnetic resonance signal generated from the subject; and a calculation unit that performs control of the imaging unit and image reconstruction using the nuclear magnetic resonance signal, wherein the calculation unit includes a camera image acquisition unit that acquires a camera image of the subject placed on the table before the subject is transported to the imaging space, an optimal disposition presentation unit that uses the camera image to present an optimal disposition of equipment to be mounted on the subject, and a determination unit that determines safety of an operation of setting up the subject in the imaging space, by using a camera image of the subject on which the equipment is mounted, wherein the equipment is a receive coil used in the magnetic resonance imaging apparatus, and the optimal disposition presentation unit presents a disposition position of the receive coil for obtaining high image quality for an examination site of the subject, as the optimal disposition, and wherein the receive coil is a multi-channel coil consisting of a plurality of channels, and the optimal disposition presentation unit includes a channel presentation unit that presents some channels from the plurality of channels as optimal channels for obtaining high image quality.

13. An imaging support method of supporting an operation of setting up a subject in an imaging apparatus including an imaging space and a table on which the subject is placed and which transports the subject to the imaging space, the imaging support method comprising:

a camera image acquisition step of acquiring a camera image of the subject placed on the table;

an optimal disposition presentation step of using the camera image to present an optimal disposition of equipment to be mounted on the subject;

a determination step of determining safety of the setup operation by using a camera image of the subject on which the equipment is mounted; and a result presentation step of presenting a determination result of the determination step, the equipment being a receive coil used in a magnetic resonance imaging apparatus, the receive coil being a multi-channel coil consisting of a plurality of channels, the optimal disposition presentation step presenting a disposition position of the receive coil for obtaining high image quality for an examination site of the subject, as the optimal disposition, and the optimal disposition presentation step presenting some channels from the plurality of channels as optimal channels for obtaining high image quality.

14. The imaging support method according to claim 13, wherein, in a case in which a re-disposition of the equipment is performed after the result presentation step, the determination step and the result presentation step are repeated.

15. The imaging support method according to claim 14, further comprising:

a second optimal disposition presentation step of presenting a second optimal disposition different from the optimal disposition in a case in which repetitions of the determination step and the result presentation step exceed a predetermined number.

* * * * *